United States Patent [19]

Berry et al.

[11] Patent Number: 5,064,681
[45] Date of Patent: Nov. 12, 1991

[54] SELECTIVE DEPOSITION PROCESS FOR PHYSICAL VAPOR DEPOSITION

[75] Inventors: Christopher J. Berry, Ossining; Jerome J. Cuomo, Lincolndale; C. Richard Guarnieri, Somers; Dennis S. Yee, Putnam Valley, all of N.Y.

[73] Assignee: International Business Machines Corporation, Armonk, N.Y.

[21] Appl. No.: 364,071

[22] Filed: Jun. 8, 1989

Related U.S. Application Data

[63] Continuation of Ser. No. 899,189, Aug. 21, 1986, abandoned.

[51] Int. Cl.$^5$ .............................................. B05D 3/06
[52] U.S. Cl. .................................... 427/36; 427/43.1; 427/53.1; 427/54.1; 427/56.1; 427/124
[58] Field of Search ................. 156/345; 427/36, 43.1, 427/53.1, 54.1, 56.1, 124

[56] References Cited

U.S. PATENT DOCUMENTS

| | | | |
|---|---|---|---|
| 3,436,468 | 4/1969 | Haberecht . | |
| 4,239,788 | 12/1980 | Beck | 427/43.1 |
| 4,261,800 | 4/1981 | Beckenbaugh et al. . | |
| 4,268,536 | 5/1981 | Beckenbaugh et al. . | |
| 4,281,030 | 7/1981 | Silfvast . | |
| 4,324,854 | 4/1982 | Beauchamp et al. | 427/53.1 |
| 4,329,418 | 5/1982 | Kny et al. | 427/43.1 |
| 4,340,617 | 7/1982 | Deutsch et al. . | |
| 4,357,364 | 11/1982 | Jones | 42/43.1 |
| 4,372,989 | 2/1983 | Menzel . | |
| 4,413,020 | 11/1983 | McKee et al. . | |
| 4,414,059 | 11/1983 | Blum et al. . | |
| 4,427,723 | 1/1984 | Swain . | |
| 4,440,801 | 4/1984 | Aviram et al. . | |
| 4,457,817 | 7/1984 | Bobeth et al. . | |
| 4,457,972 | 7/1984 | Griffith et al. | 427/43.1 |
| 4,460,436 | 7/1984 | Hiraoka | 156/643 |
| 4,489,102 | 12/1984 | Olmer et al. . | |
| 4,504,354 | 3/1985 | George et al. . | |
| 4,508,749 | 4/1985 | Brannon et al. . | |
| 4,511,595 | 4/1985 | Inoue | 427/53.1 |
| 4,554,458 | 11/1985 | Behringer et al. . | |
| 4,568,632 | 2/1986 | Blum et al. . | |
| 4,570,332 | 2/1986 | Yamauchi | 427/43.1 |
| 4,594,263 | 6/1986 | Folk et al. . | |
| 4,595,601 | 6/1986 | Horioka et al. . | |
| 4,605,566 | 8/1986 | Matsui et al. | 427/43.1 |
| 4,606,788 | 8/1986 | Moran | 156/656 |
| 4,608,332 | 8/1986 | Ward | 427/43.1 |
| 4,615,765 | 10/1986 | Levinson et al. . | |
| 4,615,904 | 10/1986 | Ehelich et al. | 427/53.1 |

(List continued on next page.)

OTHER PUBLICATIONS

Rothenberg et al., *Nuclear Instruments and Methods in Physical Research*, B1 (1984), 291–300.
Coburn et al., *IBM Technical Disclosure Bulletin*, vol. 27, No. 5, Oct. 1984.
Kirk Othmer, *Ency. of Chem. Tech.*, (1980), vol. 10, pp. 247–283.
Neugebauer, Handbook of Thin Film Technology, Chp. 8, Condensation, Nucleation and Growth of Thin Films, McGraw Hill (1970), Ed.: Maissel.

Primary Examiner—David A. Simmons
Assistant Examiner—Thi Dang
Attorney, Agent, or Firm—Scully, Scott, Murphy & Presser

[57] ABSTRACT

The invention relates to a dry method for depositing a material on a substrate having nucleating sites for the material which includes deposition of a material in the vapor phase on the substrate and simultaneous ablation of the substrate by ablation methods for controlled removal of the nucleating sites from the substrate. The removal of the nucleating sites is controlled to minimize or selectively prevent coating of the substrate by the material. The method can be used to form material patterns on the substrate such as electrical circuits or for adhering material to a substrate that is difficult to metallize such as organic polymers or ceramics.

19 Claims, 3 Drawing Sheets

U.S. PATENT DOCUMENTS

| | | | |
|---|---|---|---|
| 4,617,085 | 10/1986 | Cole, Jr. et al. | |
| 4,626,315 | 12/1986 | Kitamoto et al. | |
| 4,640,739 | 2/1987 | Modic et al. | 156/659.1 |
| 4,644,127 | 2/1987 | La Rocca | |
| 4,659,429 | 4/1987 | Isaacson et al. | 156/643 |
| 4,659,587 | 4/1987 | Mura et al. | 427/36 |
| 4,687,539 | 8/1987 | Buras et al. | 156/643 |
| 4,687,544 | 8/1987 | Bersin | 156/345 |
| 4,701,342 | 10/1987 | Novembre et al. | 427/43.1 |
| 4,713,258 | 12/1987 | Umemura | 427/43.1 |
| 4,738,861 | 4/1988 | Itoh et al. | 427/36 |
| 4,780,177 | 10/1988 | Wojnarowski et al. | 156/643 |
| 4,801,352 | 1/1989 | Piruczyk | 156/345 |
| 4,810,523 | 3/1989 | Williams et al. | 427/36 |
| 4,810,601 | 3/1989 | Allen et al. | 427/36 |
| 4,842,679 | 6/1989 | Kudo et al. | 156/643 |
| 4,844,945 | 7/1989 | Bhasker et al. | 427/43.1 |
| 4,858,556 | 8/1989 | Siebert | 156/345 |
| 4,871,416 | 10/1989 | Fukuda | 156/643 |
| 4,882,008 | 11/1989 | Garza et al. | 156/643 |
| 4,895,735 | 1/1990 | Cook | 427/53.1 |
| 4,908,096 | 3/1990 | Zupancic | 427/43.1 |
| 4,916,115 | 4/1990 | Mantese et al. | 427/53.1 |
| 4,930,439 | 6/1990 | Sato et al. | 427/43.1 |

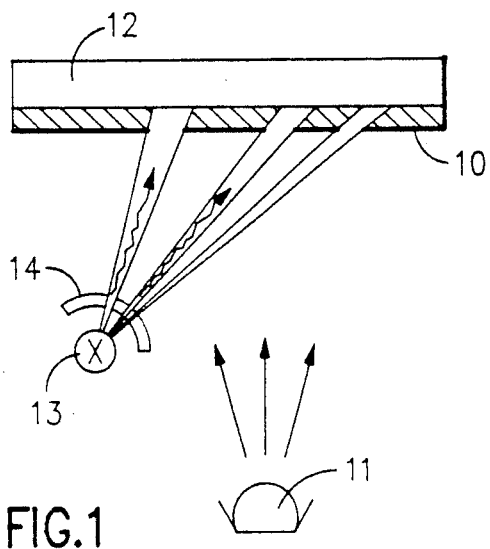
FIG.1
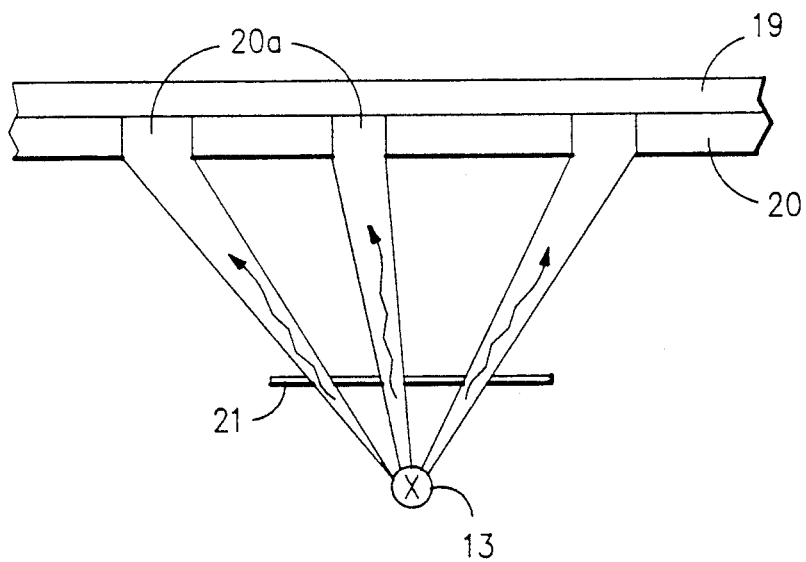
FIG.2.1

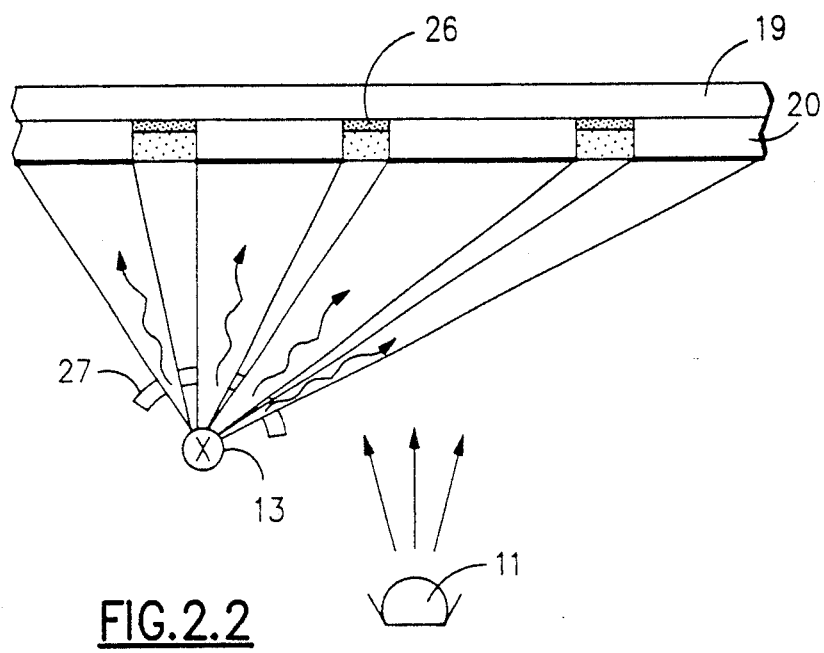
FIG.2.2
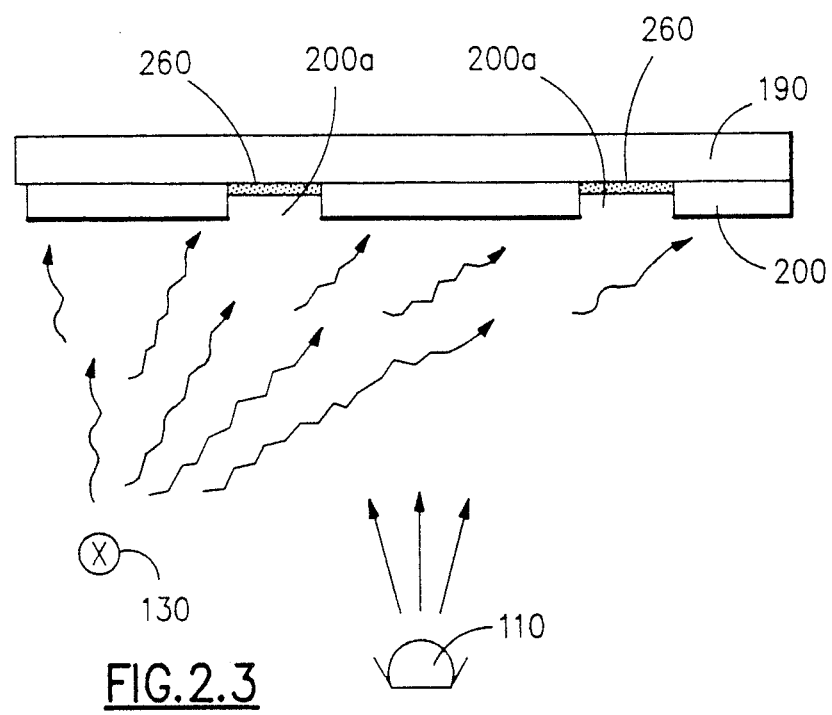
FIG.2.3

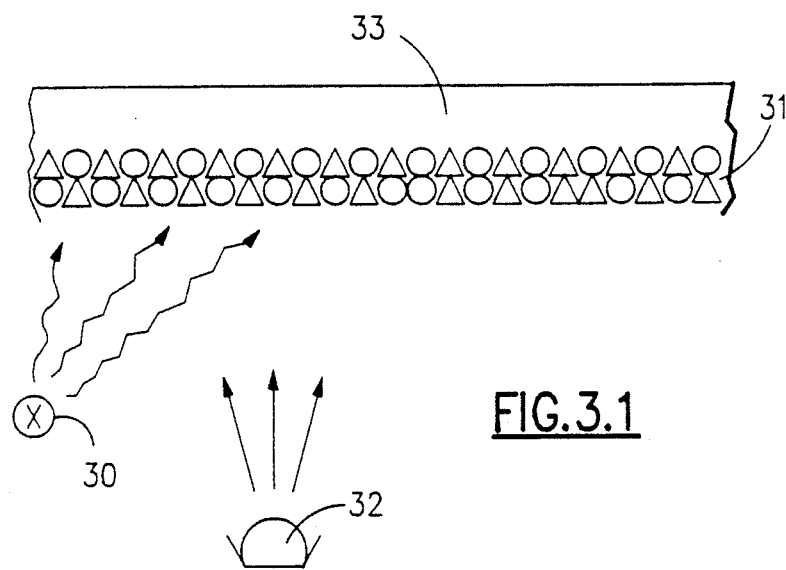
FIG.3.1
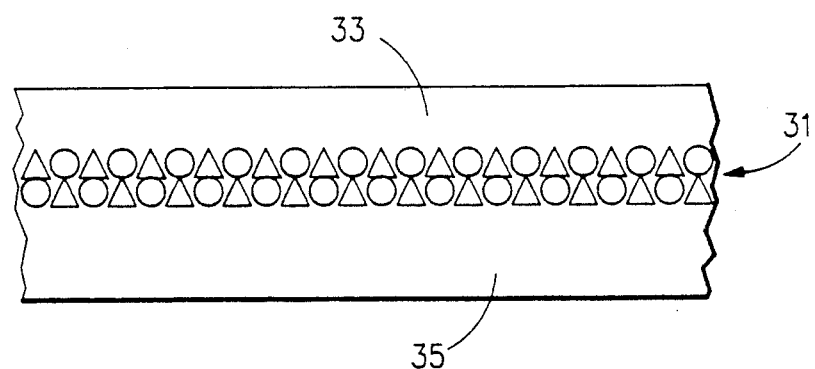
FIG.3.2
△ — POLYMER 33
○ — METAL 35

SELECTIVE DEPOSITION PROCESS FOR PHYSICAL VAPOR DEPOSITION

This is a continuation of copending application Ser. No. 899,189, filed on Aug. 21, 1986, now abandoned.

DESCRIPTION

1. Technical Field

This invention relates to a dry method for the deposition of materials on a substrate, and more particularly, minimization of the number of steps required. These materials are often used in circuit patterns in microelectronic devices. In particular, these materials can be metals, semiconductors or insulators. Although the materials are described in some instances herein as a metal "layer" or "layers" it is intended that such description also include other materials such as semiconductor materials, insulating materials, the equivalents thereof as noted herein as well as the art-known equivalents.

2. Prior Art

In microelectronic circuitry and other applications, it is often necessary to deposit layers of materials on a substrate.

Metals such as copper and nickel, have been deposited on organic polymer films by processes wherein the entire surface of the polymer has been coated with the metal by electroless plating or vapor deposition. It is then covered with a resist layer which is later exposed to define the pattern of the metal to be left on the polymer. After removal of the unwanted metal by anisotropic etching, reactive ion etching or laser enhanced reactive etching, the final circuit pattern is obtained U.S. Pat. No. 3,436,468 describes a technique to form circuit patterns in which selected areas of a polymer film are exposed to an electron beam, after which metals such as nickel and copper are electrolessly plated on the polymer. These metals plate only those areas of the polymer which have been struck by the electron beam. The electron beam in used to locally decompose the polymer to alter its chemical structure. The altered chemical structure provides a region of the polymer having a lower resistance than the rest of the polymer, thereby promoting electroless metal plating only in those regions of the polymer struck by the electron beam.

U.S. Pat. No. 4,268,536 describes another process for forming a metal layer on a polymer wherein ultraviolet light is used to image a pattern on a sensitized surface in order to form catalytic sites for electroless deposition in the imaged area Beckenbaugh et al., U.S. Pat. No. 4,261,800 describe a process for selectively depositing a metal on a surface of a substrate wherein ultraviolet light is used to selectively render areas of the substrate treated with hydrazine incapable of reducing the metal species subsequently applied.

Aviram et al., U.S. Pat. No. 4,440,801 describe the preparation of a substrate for electroless deposition of a metal by selectively irradiating the desired metal sites with ultraviolet light and pre-plating. Deposition occurs only in those areas which were both exposed to ultraviolet light and subjected to the pre-plating treatment. Olmer et al., U.S. Pat. No. 4,489,102 describes a method for depositing aluminum films on a substrate by initial treatment with an aluminum hydride-trialkylamine complex followed by ultraviolet light directed to the areas where aluminum deposition is desired. Brannon et al., U.S. Pat. No. 4,508,749 describe a method for etching a polyimide body with ultraviolet light prior to metal addition.

Rothenberg et al., *Nuclear Instruments and methods in Physical Research BI* (1984) 291–300 describe a method for laser sputtering, such as sputtering $Al_2O_3$ Coburn et al., *IBM Technical Disclosure Bulletin*, Vol. 27, No. 5 Oct 1984 describes a method for removing organic polymer layers by a method described as "unzipping." UV patterning of resist materials has been described by Blum et al. U.S. Pat. No. 4,414,059. Ablative photodecomposition is employed in the fabrication process. Film deposition techniques are disclosed in Kirk-Othmer, *Encyclopedia of Chemical Technology* (1980) pp. 247–283. All of the foregoing references are incorporated herein by reference.

In the formation of a metallic layer on a substrate it is desirable to be able to selectively deposit the metal with good resolution in a minimum number of steps without the application of successive different solutions of the polymer prior to and during deposition thereto. It is also desirable to be able to provide a dry method to produce metal patterns.

SUMMARY OF THE INVENTION

The present invention relates to a dry method for depositing a metal on a substrate having nucleating sites for the metal which comprises deposition of a metal in the vapor phase on the substrate and simultaneous ablation of the substrate by ablation methods for controlled removal of the nucleating sites from the substrate. The deposition of the metal is effected by a physical process or a chemical process. The removal of the nucleating sites is controlled to minimize or selectively prevent coating of the substrate by the metal.

In one aspect of the invention, surface ablation of the substrate is directed at an area where nucleation and growth of the metal being deposited is prevented while growth in adjacent unablated areas is uninhibited.

The invention also relates to products made by the foregoing processes which include inter alia electronic circuits, especially microelectonic circuits and semiconductor devices.

In another aspect of the invention low level surface ablation is employed wherein the intensity is below the point at which condensation of the metal is prevented thereby resulting in an intermixing phenomenon between the substrate and metal. The intermixing phenomenon produces an enhancement in adhesion of the metal to the substrate. This process eliminates the need of an adhesion promoter prior to metal deposition.

BRIEF DESCRIPTION OF THE DRAWINGS

FIG. 1 schematically illustrates direct selective deposition of a pattern onto a substrate according to the present invention.

FIGS. 2.1–2.3 schematically illustrates selective formation of trenches and metal deposition into the trenches according to the present invention.

FIGS. 3.1–3.2 schematically illustrates production of an intermixed metal and substrate layer followed by metal deposition according to the present invention.

DETAILED DESCRIPTION OF THE INVENTION

The present invention relates to a dry method for depositing a metal on a substrate having nucleating sites for the metal which comprises simultaneously ablating the substrate by ablation methods such as the use of a source of ablation energy. The ablation is carried out to control the removal of the nucleating sites from the substrate. The metal is deposited in the vapor phase on the substrate whereby the removal of the nucleating sites is conducted to minimize or selectively prevent coating of the substrate by the metal.

In another embodiment, the selective removal of the nucleating sites is conducted so that a metal pattern is formed on the substrate. The selective removal of the nucleating sites to form the pattern on the substrate may be carried out so that the pattern has nucleating sites and is resistant to ablation, an area also being formed on the substrate which has nucleating sites which are susceptible to ablation. When the pattern and an area are being formed, a metal may be simultaneously deposited on the pattern while ablating the substrate whereby the area is sufficiently ablated so that it is substantially free of the metal.

When a pattern is formed on the substrate, the ablation may be effected by a mask in combination with a source of ablation energy, the mask being interposed between the source of ablation energy and the substrate for projecting an image on to the substrate whereby the pattern is formed when the substrate is being ablated. Sharper images can be obtained using optical imaging systems to image the mask onto the surface.

The pattern may also be formed on the substrate by other than ablation energy such as employing a photoresist process, ion-beam etching, solvent removal of portions of the substrate and the like. In this process, the pattern is formed on the substrate so as to have nucleating sites and is also resistant to ablation, an area also being formed on the substrate which has nucleating sites which are susceptible to ablation. When the pattern and the area are thus formed, the metal may be deposited on the pattern while simultaneously ablating the area, the area being sufficiently ablated so that it is substantially free of the metal.

Where the foregoing process utilizes an ablation process for forming a pattern, the substate may comprise two layers contiguous with one another, the top layer being susceptible to ablation whereas the bottom layer is resistant to ablation. A mask is interposed between a source of ablation energy and this two layer substrate to selectively remove the substrate to form a pattern and to leave an area that is susceptible to ablation after which the mask is removed and metal is deposited while simultaneously ablating the area to deposit metal conforming to the pattern.

Additionally, two masks may be employed where the substrate comprises a material that may be ablated so that the first mask has openings therein corresponding to the pattern and the second mask has openings therein corresponding to the area (as the pattern and the area are defined previously herein). The first mask is interposed between a source for removing the substrate and the substrate after which the nucleating sites are removed to form a substrate having the pattern and the area. The second mask is then interposed between a source of ablation energy and the substrate so that the openings of the second mask are in registration with the area. A metal is simultaneously deposited on the pattern while ablating the area through the second mask. The nucleating sites may be removed from the substrate by means of the first mask through conventional means such as a photographic processes, solvent etching and the like although in the preferred embodiment these nucleating sites are removed by employing ablation energy sources such as those described herein.

The process of the present invention also relates to minimizing the coating of the substrate with a metal by which it is meant that some metal is deposited on the substrate. This process is especially useful where the substrate ordinarily is difficult to metalize without the use of an adhesive for the metal or by micro-etching the substrate which is effected either by the physical alteration of the surface by an abrasive or by the application of an acid such as chromic acid. By employing the method of the present invention so that ablation is minimized, there is a partial intermixing of the vaporous metal with the surface of the substrate which in turn provides an area onto which additional metal may be adhered. This process is effected by using ablation energy of low intensities or lower energy so as to promote the intermixing of the substrate and the metal prior to a buildup of a thicker or heavier metal coating.

Once the intermixing is obtained by using the low intensity ablation energy, the ablation is discontinued while continuing the metal deposition to obtain a substrate coated with the metal.

Ablation is a bond scissoning process resulting in desorption, decomposition, evaporation or columbic explosion or combinations thereof.

Surface ablation can occur under a variety of radiant energy conditions such as ion beam decomposition depolymerization, volatilization, ultraviolet light ablation intense X-ray (i.e., syncotron radition) and electron beam desorption and decomposition. Ablation generally proceeds by bond scissioning of the layer first, followed by desorption and evaporation.

These processes are employed to breakdown the substrate into products such that the surface is constantly being removed. The surface removal process will inhibit nucleation and/or growth of the metals in the vapor phase thereby preventing material from accumulating in the areas that are being ablated. In some instances the accumulated material in the ablation area is swept towards the edges of the ablation zone and will be deposited there rather than desorbed.

The subsequent deposition of a layer e.g., metal proceeds by the formation of inhomegeneities on the surface caused by the ablation step.

Many substrates susceptible to ablation can be employed according to the process of the present invention including PMMA (polymethymethacrylate) epoxy resin-glass combinations, polyimides and the like. Polysulfones and other materials predominantly defined as substantially organic can also be used as well as others such as insulators i.e., $SiO_2$, $MgO$, $Al_2O_3$, and the like where the ablation flux and energy are such that the surfaces are rendered non-nucleating due to ablation.

The preferred substrate which are employed in FIGS. 1, 2.1–2.3 and 3.1–3.2 comprise silica, ceramic, laminated boards (e.g., phenolic or epoxy impregnated fiber glass boards employed in the manufacture of printed circuits) multilayer boards, and polymeric materials in general such as PMMA and the like.

The substate may comprise two layers, namely a polymer and a resist of polyimide. In this embodiment, any remaining organic material may be removed by ashing.

In addition to polymeric substrates which are susceptible to ablation, other materials may also be employed comprising compositions that have surfaces which are rapidly desorbed upon exposure to ablation energy such as ultraviolet radiation.

The present invention comprises a dry method for metal deposition in that no solutions are required to form a metal film on the substrate. The metal may be deposited as a metal vapor. As described previously, the metal herein describes a material that demonstrates the process, whereas semiconductors and insulators can also be used. The process for metal deposition are evaporation, sputtering, and chemical vapor deposition.

In some instances the invention may be practiced to deposit a layer or layers on the substrate that are the same or substantially the same as the substrate. For example, the substrate may be MgO subjected to ablation as described herein and the layer deposited may he a MgO layer.

Chemical vapor deposition CVD can be effected by providing a pre-patterned nucleating layer of $WF_6/H_2$ on the substrate, exposing the $WF_6/H_2$ layer to temperatures of about 300° C. in the presence of hydrogen to obtain tungsten on the surface at the nucleating sites. In this process the substrate is also exposed to ablation energy as described herein and the non-nucleating sites are ablated. Insulating patterned carbon can be similarly deposited on the substrate by employing methane in lieu of $WF_6/H_2$ in a plasma CVD. This carbon can be deposited on room temperature substrates.

Layers that may be deposited by physical methods (as oppose to CVD methods) according to the present invention comprise the physical vapor deposition of materials of the class of metals such as gold, copper, nickel, titanium chromium and the like; alloys and compounds such as Al/Cu, Al/Si, Ti/W, Pd/Ni, TiN, ZrN, HfN, and the like; semiconductors such as Ge, Si, GaAs, AlN and the like; insulators such as $Al_2O_3$, SiO, $MgF_2$, $ZrO_2$, $HfO_2$, $MgO_2$ and the like, and polymers such as Teflon.

The nucleating sites are those sites on the substrate where metal deposition takes place. Nucleation sites are those sites where material which has condensed from the vapor phase aggregate to form of solid phase on a surface. These aggregates can form islands before being removed by the ablative process.

Nucleating sites can be selectively designated or nucleation can be minimized to allow intermixing of the metal and substrate. To selectively prevent nucleation, a mask may be employed between the ablation source and substrate. The mask may be positioned close to the substrate or close to the ablation energy source.

Nucleation is further described by Maissel, et al., *Handbook of Thin Film Technology*, McGraw-Hill (1983), especially Chapter 8. This text is incorporated herein by reference.

The present invention for the described dry method of metal deposition is illustrated by the applications presented in the figures herein.

FIG. 1 illustrates the one step process of metal deposition 10 (e.g. copper) from a vapor source 11 onto a substrate 12 (e.g. PMMA) with simultaneous selective ablation originating from an ablation energy source 13 directed through a mask 14 thereby providing the selectivity. In this process the ablation conditions are of sufficient energy fluence to prevent any metal deposition in the ablated areas.

The two step process illustrated in FIGS. 2.1 and 2.2 allows initially formed trenches 20a in polymer 20 (e.g. PMMA) on substrate 19 (e.g. glass) to be filled with metal 26 (e.g. copper) as the initially unablated areas are then ablated by use of a mask 27 which is a negative of the initially used mask 21. Vapor source 11 and ablation energy source 13 are the same as in FIG. 1. The trenches are formed by ablation of sufficient energy fluence and in the second step the ablation is of sufficient energy fluence to selectively prevent metal deposition. This process allows filling of "gapless" trenches with condensing metal while preventing overhang of the metal and may be referred to as planerization. Stated otherwise, planerization occurs when the trenches 20a are filled with metal 26 so that polymer 20 and metal 26 have a surface that lies in the same outer plane, i.e. the plane facing vapor source 11.

The illustrated technique of FIGS. 3.1 and 3.2 utilizes low intensity ablation energy source 30 initially so that an intermixed layer 31 of substrate 33 (e.g. PMMA) and metal 35 (e.g. copper) is formed as metal produced at the vapor source 32 is simultaneously deposited. After a sufficient thickness of the intermixed layer is formed, the ablation source is turned off and the metal is allowed to deposit thereby resulting in a final product 35 of metal on a substrate wherein adhesion has been enhanced by the intermediate intermixed layer.

FIG. 2.3 shows a "broad beam" process wherein a substrate 190 comprising glass having a polymer 200 (PMMA) with pre-formed openings 200a is exposed to a vapor source 110 (e.g. copper) simultaneously with an ablation energy source 130. A metal 260 such as copper is deposited in openings 200a. In this embodiment ("broad beam" process) the ablation energy is not employed to form the pattern. The pre-formed pattern may be produced by any art-known method such as by mechanically removing portions of the PMMA film.

The following examples are illustrative.

EXAMPLE 1

For the direct patterning process schematically illustrated in FIG. 2.1, an excimer laser was used as the ablation source. Photons with an energy of 6.42 eV (193 nm wavelength) were pulsed at a repetition rate of 1 Hz and an energy density of 0.12 joules per square centimeter per pulse. Copper was vapor deposited at a rate of 1.5 nm/sec onto a PMMA (polymethyl methacrylate) substrate. Copper is deposited where the opaque areas of the mask are imaged. There is no deposition where the PMMA is ablated.

EXAMPLE 2

For the direct patterning process schematically illustrated in FIG. 2.2 an excimer laser was used as described above except an energy density of 0.093 joules per square is used. Copper is vapor deposited at a rate of 2 nm/sec onto a patterned substrate. The substrate is a patterned 12 micrometer thick polyimide film on quartz. Copper is deposited on the quartz where the polyimide has been etched away. There is no copper deposition on the polyimide.

EXAMPLE 3

For the production of an intermixed metal and substrate layer schematically illustrated FIG. 3.1, a mercury fluorescence light was used as the ablation source. The continuous energy density at the substrate is 0.0018 joules per square centimeter.

Copper was deposited at a rate of 0.0005 nm/sec. on the same substrate as in example 2.

Although the invention has been described by reference to some preferred embodiments, it is not intended that the novel method for depositing a material on a substrate be limited thereby but various modifications are intended to be included as falling within the spirit and broad scope of the foregoing disclosure, the attached drawings and the following claims.

Having thus described our invention, what we claim as new, and desire to secure by Letters Patent is:

1. A dry method for depositing a material on a substrate having nucleating sites for said material which comprises simultaneously:
   (a) ablating said substrate by ablation means for controlling the removal of said nucleating sites from said substrate; and
   (b) depositing said material in the vapor phase on said substrate, the removal of said nucleating sites being conducted to minimize or selectively prevent coating of said substrate by said material.

2. The method of claim 1 which further comprises selectively removing said nucleating sites so that said material is in a pattern which is formed on said substrate.

3. The method of claim 2 which further comprises:
   selectively removing said nucleating sites to form (i) a pattern, on said substrate having nucleating sites, said pattern being resistant to ablation and (ii) an area on said substrate having nucleating sites, said area being susceptible to ablation;
   simultaneously depositing said material on said pattern when ablating said substrate;
   said area being sufficiently ablated so that it is substantially free of said material.

4. The method of either claims 2 or 3 comprising selectively removing said nucleating sites by said ablation means, said ablation means comprising mask means for projecting an image onto said substrate and a source of ablation energy, said mask means interposed between said source of ablation energy and said substrate, said pattern being formed when ablating said substrate.

5. The method of claim 2 which further comprises the steps of:
   selectively removing said nucleating sites without depositing said material to thereby form (i) a pattern on said substrate having nucleating sites, said pattern being resistant to ablation and (ii) an area on said substrate having nucleating sites, said area being susceptible to ablation;
   followed by depositing said material on said pattern while;
   simultaneously ablating said area; said area being sufficiently ablated so that it is substantially free of said material.

6. The method of claim 5 or 3 comprising selectively removing said nucleating sites by mask means for projecting an image onto said substrate, said mask means being interposed between means for removing said substrate and said substrate.

7. The method of claim 6 where said means for removing said substrate comprises at least one ablating means for removing said substrate selectively.

8. The method of claim 6 where said mask means comprises first mask means having opening means therein corresponding to said pattern and second mask means having opening means therein corresponding to said area, said method comprising interposing said first mask means between said means for removing said substrate and said substrate, removing said nucleating sites to form a substrate having said pattern and said area, interposing said second mask means between said ablation means and said substrate so that said openings of said second mask means are in registration with said area having said pattern and simultaneously depositing said metal on said pattern while ablating said area through said second mask means.

9. The method of claim 8 where said means for removing said substrate comprises ablation means.

10. The method of claim 1 wherein the ablation is of low intensity to promote intermixing of said substrate and said material.

11. The method of claim 10 where said ablation is discontinued while continuing said material deposition to obtain said substrate coated with said meterial.

12. The method of either claims 1, 2 or 5 where said substrate comprises a material that can be ablated by radiant energy.

13. The method of claim 12 where said substrate comprises a polymer.

14. The method of claim 12 where said substrate comprises a polymer that can be ablated by ion beam decomposition; ultra violet light; electron beam decomposition and electron beam desorption or combinations thereof.

15. The method of claim 12 where said polymer is selected from a member of the group consisting of methyl methacrylate, epoxy and polyimide polymers and mixtures thereof.

16. The method of claim 5 where said substrate comprises first layer means that can be ablated by radiant energy, said first layer being contiguous to second layer means that has said nucleating sites and is resistant to ablation.

17. The method of claim 16 where said first layer means comprises a polymer and said second layer means comprises a member selected from the group consisting of ceramics, glass, silica and laminated boards, and said material is selected from a member of the group consisting of metals, metal alloys, semiconductors and insulators.

18. The method of claim 1 where said substrate and said material are the same.

19. The method of claim 3 where said pattern comprises trench means, and said material is deposited in said trench means in an amount sufficient to obtain filled trench means, said filled trench means and said area all being in substantially the same outer plane.

* * * * *